(12) United States Patent
Jones (10) Patent No.: US 7,148,577 B2
(45) Date of Patent: Dec. 12, 2006

(54) MATERIALS FOR ELECTRONIC DEVICES

(75) Inventor: Keith D. Jones, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/750,491

(22) Filed: Dec. 31, 2003

(65) Prior Publication Data

US 2005/0151270 A1 Jul. 14, 2005

(51) Int. Cl.
*H01L 23/48* (2006.01)
*H01L 23/52* (2006.01)
*H01L 29/40* (2006.01)

(52) U.S. Cl. .................. 257/782; 257/700
(58) Field of Classification Search .......... 257/783, 257/782, 778, 787, 789, 795, 700; 438/118, 438/119, 125
See application file for complete search history.

(56) References Cited

U.S. PATENT DOCUMENTS

| | | | | |
|---|---|---|---|---|
| 3,568,012 | A * | 3/1971 | Ernst et al. | 257/786 |
| 3,568,021 | A * | 3/1971 | Ernst et al. | 318/808 |
| 4,135,038 | A * | 1/1979 | Takami et al. | 428/427 |
| 5,919,720 | A | 7/1999 | Sleight et al. | |
| 6,110,596 | A * | 8/2000 | Kasori et al. | 428/428 |
| 6,326,685 | B1 * | 12/2001 | Jin et al. | 257/706 |
| 6,365,269 | B1 * | 4/2002 | Atzesdorfer et al. | 428/331 |
| 6,673,279 | B1 | 1/2004 | Gardner | |
| 2002/0105093 | A1 * | 8/2002 | Papathomas | 257/778 |
| 2003/0215661 | A1 | 11/2003 | Lo et al. | |
| 2004/0214377 | A1 * | 10/2004 | Starkovich et al. | 438/126 |
| 2005/0110168 | A1 * | 5/2005 | Chuang | 257/788 |

OTHER PUBLICATIONS

J. Qu et al., "Effective Elastic Modulus of Underfill Material for Flip-Chip Applications", The Woodruff School of Mechanical Engineering, School of Material Science and Engineering, Packaging Research Center, Georgia Institute of Technology, 3 pages.
Discussion within the present Information Disclosure Statement.
Gail, R., "Breakthrough ceramic can take the heat" pp. 3, Electronic Engineering Times, May 20, 1996.
Evans, J.S.O., et al. "Negative thermal expansion materials", pp. 1 Abstract, www.ei.org/ (2001).
Chang, W., Technical Literature, "Zirconium Tungstate" pp. 17, printed on Dec. 10, 2001.
Perottoni, et al., "Pressure-induced amporhization and negative thermal expansion in Zr2W2O8" Science, May 8, 1998, v280 n5365 p886(4), pp. 4, http://web2.insite2.gale.com/.
Anonymous, "Zirconium Tungstate Behavior Explained" High Tech Ceramics News, Apr. 1, 1997 v8 i12 pN/A, pp. 2.
Anonymous, "Optoelecronics: Zirconium Tungstate Behvior Explained" Optical materials & Engineering News, Feb. 1, 1997 v7 i6 pN/A, pp. 2.
Evans, et al., "Compressibility, phase transitions, and oxygen migration in zirconium tungstate, ZrW2O8" Science, Jan. 3, 1997, v275 n5296 p61 (5), pp. 6.

(Continued)

*Primary Examiner*—S. V. Clark
(74) *Attorney, Agent, or Firm*—Blakely, Sokoloff, Taylor & Zafman LLP (57) ABSTRACT

Improved materials for use in the fabrication of electronic devices and devices made therewith are described. The materials comprise fillers having a negative coefficient of thermal expansion.

17 Claims, 5 Drawing Sheets

OTHER PUBLICATIONS

Anonymous, "Ceramic in wonderland: materials science" The Economist (US), Apr. 27, 1996 v339 n7963 p88(2), pp. 2.

Anonymous, "Zirconium Tungstate Intrigues Researchers" New Technology Week, Apr. 15, 1996 v10 i16 pN/A, pp. 1.

Anonymous, "Introducing the incredible shrinking ceramic . . ." New Scientist, Apr. 13, 1996, p17, pp. 2.

Mary, et al., "Negative thermal expansion form 0.3 to 1050 Kelvin in $ZrW_2O_8$" Science, Apr. 5, 1996, v272 n5258 p90(3), pp. 5.

* cited by examiner

MATERIALS FOR ELECTRONIC DEVICES

FIELD OF THE INVENTION

Improved materials for use in the fabrication of electronic devices comprising fillers with a negative coefficient of thermal expansion and components made therewith are described.

BACKGROUND INFORMATION

The construction of electronic devices involves the combination of a variety of materials exhibiting various mechanical and electrical properties. A designer or manufacturer of such devices may choose materials based in part on the mechanical and electrical properties of the materials in order to achieve performance and/or reliability in the devices.

Some materials used in electronic devices can be modified by adding fillers thereto. Fillers can be chosen to modify the Theological, thermal, and/or mechanical properties of the materials to which they are added. However, the use of fillers to advantageously modify one property can also introduce undesired modifications to one or more other properties in those materials. Thus, a manufacturer of electronic devices may be forced to choose a proportion of filler which is more or less than ideal with regard to one property in order to mitigate an adverse impact on other properties.

Electronic devices are frequently assembled from a semiconductor die and a next level package. The next level package may be, for example, a substrate, an interposer, a printed circuit board, or a printed wiring board. Substrates may comprise a core upon which is built one or more layers of wiring and build up dielectric. Substrates are typically formed with alternating layers of conductive material and build up dielectric material. Wiring patterns, commonly known as traces, may be built in the conductive material through various etching processes such as wet etching which are known in the art and will not be described further herein. A semiconductor die may be joined with the next level package by soldered interconnects and have an underfill agent disposed between them.

Electronic devices so constructed suffer from a number of stresses resulting from differing coefficients of thermal expansion in the various materials employed. For example, the substrate core may have a different coefficient of thermal expansion than the build up dielectric layers. Similarly, the underfill agent may have a different coefficient of thermal expansion than the next level package, the soldered interconnects, or the semiconductor die. The resulting stresses can lead to defects such as via delamination and corner fillet cracking in the underfill material, mechanical failures to the interconnects, and cracks in the interlayer dielectric of the semiconductor die.

As previously mentioned, the coefficients of thermal expansion for some of the materials used in the construction of electronic devices can be modified by the addition of fillers. For example, the material used for the substrate build up dielectric layer may be modified with a silica filler to reduce the coefficient of thermal expansion of the layer. Similarly, the underfill agent used in joining the semiconductor die with the next level package may be modified with a silica filler to reduce its coefficient of thermal expansion. However, known fillers may be inadequate to sufficiently modify these materials because heavily modified materials may exhibit poor flow characteristics and other undesirable properties. Thus, designers of electronic devices may be faced with using materials which have coefficients of thermal expansion greater than desired in order to retain in those materials other important qualities such as viscosity or filler loading. Hence, there is a significant need in the art for improved materials,

DETAILED DESCRIPTION

In the following description numerous specific details are set forth. However, it is understood that embodiments may be practiced without these specific details. It is also understood that the description of particular embodiments is not to be construed as limiting the disclosure to those embodiments. Well-known circuits, structures and techniques have not been shown in detail in order not to obscure the understanding of this description.

As used herein, "filler" means any material used to modify another material by combination therewith. Fillers may be solids, liquids, slurries, powders, crystals or any other phase. Fillers may be a single substance or a combination of substances. Fillers may be present in any ratio, including forming the bulk of the modified material.

As used herein, "CTE" means coefficient of thermal expansion. A coefficient of thermal expansion may be described in a number of ways. One description uses the unit of measure "ppm/degree C.", meaning parts-per-million per degree Centigrade. For example, a material having a CTE of 100 ppm/degree C., when heated through a temperature change of 100 degrees Centigrade, will expand by (10,000/1,000,000), equivalent to a 1% expansion. The use of "CTE" and "ppm/degree C." in this disclosure is simply for explanatory purposes and no limitation is implied by the use of these terms.

As used herein, "negative CTE" means a coefficient of thermal expansion less than zero and "positive CTE" means a coefficient of thermal expansion greater than zero.

Reliability in electronic devices can be improved by employing materials with comparable coefficients of thermal expansion. The coefficient of thermal expansion of a silicon die may be approximately 3 ppm/degree C. The coefficient of thermal expansion of a substrate may be 17 ppm/degree C. for a substrate having an FR4 core, or lower, such as approximately 8 ppm/degree C. one having an Alloy 42 core. Solder, frequently used for making mechanical and electrical connections between the die and the substrate, may have a coefficient of thermal expansion of approximately 28 ppm/degree C. Unmodified build up dielectric material may have a coefficient of thermal expansion of approximately 100 ppm/degree C. Unmodified underfill material may have a coefficient of thermal expansion of approximately 100 ppm/degree C. Silica, a common positive CTE material used as filler, has a CTE of approximately 4 to 5 ppm/degree C.

Figure 1:
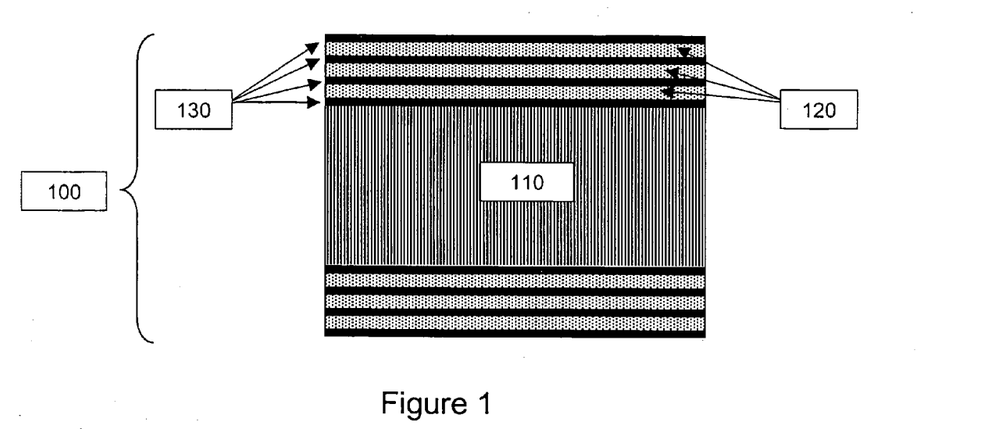
FIG. 1 depicts part of a package for an electronic device according to an embodiment of the present invention, wherein substrate dielectric build up layers comprise a filler having a negative coefficient of thermal expansion.

FIG. 1 depicts a simplified view of part of a substrate 100 for an electronic device according to one embodiment of the present invention. Substrate 100 comprises core 110 and multiple layers of build up dielectric material 120 modified with a filler, the filler exhibiting a negative coefficient of thermal expansion.

Core 110 may be an organic material such as FR-4. FR-4 is a core having a woven glass mat and an epoxy resin. The coefficient of linear expansion for FR-4 is approximately 17 ppm/degree C. Substrate 100 is also shown with multiple layers of conductive material 130 having conductive traces. Conductive material 130 is preferably copper, though those skilled in the art will appreciate that the present invention is not limited by the choice of conductive material. While FIG. 1 depicts layers of build up dielectric 120 and layers of conductive material 130 on two faces of core 110, those skilled in the art will understand that layers of materials 120 and 130 may instead be employed on only one face of core 110. Additionally, those skilled in the art will appreciate that more or fewer layers of materials 120 and 130 may be employed, and that additional layers or materials not shown may also be employed.

According to this embodiment of the present invention, build up dielectric material 120 preferably comprises an epoxy-acrylate binder filled with zirconium tungstate. Those skilled in the art will realize that the present invention is not limited to epoxy-acrylate binders, nor is it limited to zirconium tungstate, and that various other binders and negative CTE fillers may be used. Zirconium tungstate ($ZrW_2O_8$) is a member of the class of compounds having the chemical composition $Zr_xW_yO_z$. Zirconium tungstate is a crystalline material having a nearly isotropic negative coefficient of thermal expansion, averaging approximately −8.8 ppm/degree C. over the temperature range of −273 to 127 degrees C. for the alpha phase and averaging approximately −4.9 ppm/degree Centigrade over the temperature range 157 to 677 degrees Centigrade for the beta phase. That is, zirconium tungstate has the property that it contracts when heated.

By modifying the epoxy-acrylate binder through the addition of zirconium tungstate, the coefficient of thermal expansion of build up dielectric layers 120 can be reduced to more closely match that of substrate 100. The effective coefficient of thermal expansion for build up dielectric material 120 comprising epoxy-acrylate and zirconium tungstate filler can be described by the rule of mixtures, wherein build up dielectric material 120 exhibits a coefficient of thermal expansion reflecting the relative amounts of the epoxy-acrylate and zirconium tungstate and their respective coefficients of thermal expansion.

The rule of mixtures is a formula used to predict the coefficient of thermal expansion of a composite, based on known coefficients of thermal expansion of the individual components. A common form of the rule of mixtures for predicting the CTE of a two-component composite is the linear expression: $\alpha_c = \alpha_1 + (\alpha_2 - \alpha_1) V_2$, where $\alpha_c$ is the composite CTE, $\alpha_1$ and $\alpha_2$ are the CTEs for component 1 and component 2, respectively, and $V_2$ is the volume fraction of the second component. From this description it is apparent that the coefficient of thermal expansion of build up dielectric material 120 can be reduced by raising the proportion of zirconium tungstate relative to epoxy-acrylate binder.

The use of a negative CTE filler at a given volume fraction loading will result in the modified build up dielectric material having a lower coefficient of thermal expansion than it would have if modified with a positive CTE filler at that same volume fraction loading. Thus, the use of a negative CTE filler will allow designers of electronic devices to modify the build up dielectric material to have a lower coefficient of thermal expansion than could be achieved under like conditions using a filler having a positive CTE.

Figure 2:
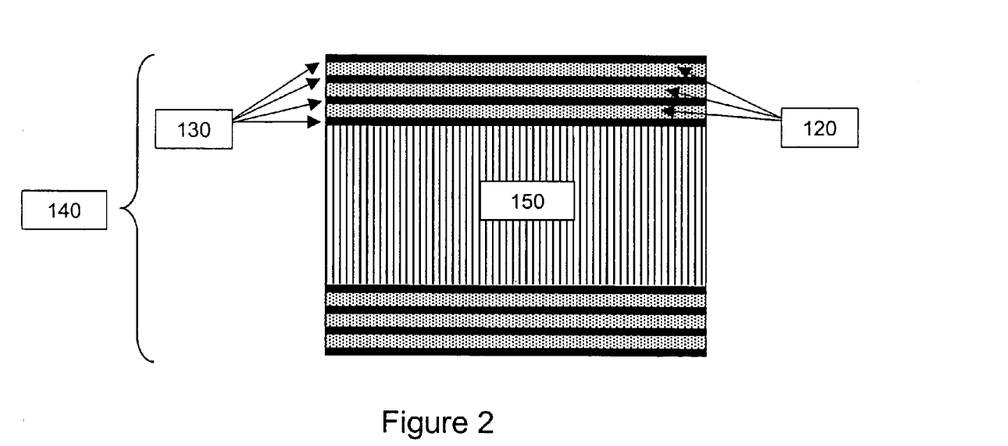
FIG. 2 depicts part of a package for an electronic device according to another embodiment of the present invention, wherein substrate dielectric build up layers comprise a filler having a negative coefficient of thermal expansion and wherein the filler loading has been reduced to yield different rheological properties.

FIG. 2 depicts a simplified view of a substrate 140 according to another embodiment of the present invention. Substrate 140 comprises core 150 and multiple layers of build up dielectric material 120 modified with a filler, the filler exhibiting a negative coefficient of thermal expansion.

According to this embodiment of the present invention, core 150 comprises a metal having a low coefficient of thermal expansion, such as Alloy 42. Alloy 42 is a nickel-iron alloy having a coefficient of linear expansion of approximately 8 ppm/degree C.

Substrate 140 is also shown with multiple layers of conductive material 130 having conductive traces. Conductive material 130 is preferably copper, though those skilled in the art will appreciate that the present invention is not limited by the choice of conductive material. While FIG. 2 depicts layers of build up dielectric 120 and layers of conductive material 130 on two faces of core 150, those skilled in the art will understand that layers of materials 120 and 130 may instead be employed on only one face of core 140. Additionally, those skilled in the art will appreciate that more or fewer layers of materials 120 and 130 may be employed, and that additional layers or materials not shown may also be employed.

According to this embodiment of the present invention, build up dielectric material 120 preferably comprises an epoxy-acrylate binder filled with zirconium tungstate. Those skilled in the art will realize that the present invention is not limited to epoxy-acrylate binders, nor is it limited to zirconium tungstate, and that various other binders and negative CTE fillers may be used.

In this embodiment, build up dielectric layers 120 have a coefficient of linear expansion which is more disparate to core 150 than they would have to an organic FR-4 core, since core 150 has a lower coefficient of thermal expansion than an organic FR-4 core. However, since the layers of build up dielectric material 120 are modified with zirconium tungstate, the CTE of build up dielectric material 120 will be closer to that of core 150 than would be the case when using a known build up material, such as one filled with silica. Thus, reliability in electronic devices comprising Alloy 42 or other low-CTE metal cores may be improved over the state of the art by using build up dielectric layers 120.

Figure 3:
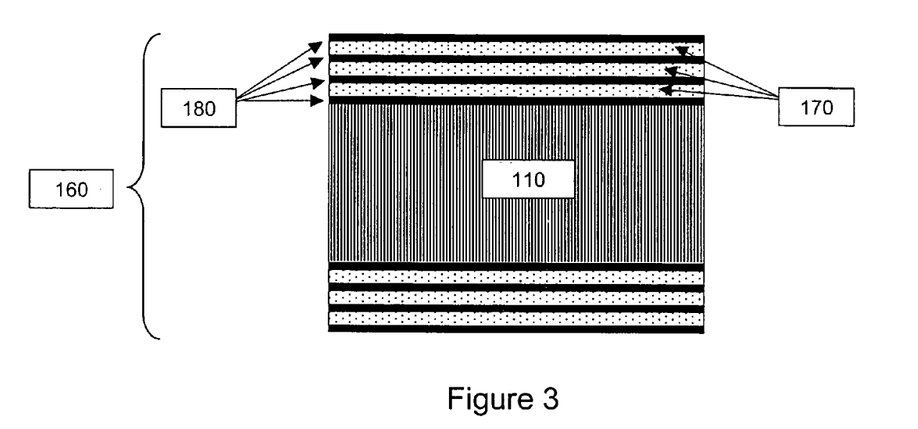
FIG. 3 depicts part of a package for an electronic device according to yet another embodiment of the present invention, wherein substrate dielectric build up layers comprise a filler having a negative coefficient of thermal expansion and wherein the core material exhibits a low coefficient of thermal expansion.

FIG. 3 depicts a simplified view of substrate 160 for an electronic device according to yet another embodiment of the present invention. Substrate 160 comprises core 110 and multiple layers of build up dielectric material 170 modified with a filler, the filler having a negative coefficient of thermal expansion.

Substrate 160 is also shown with multiple layers of conductive material 180 having conductive traces. Conductive material 180 is preferably copper, though those skilled in the art will appreciate that the present invention is not limited by the choice of conductive material. Material 180 comprises conductive traces formed with a smaller line width than traces formed in the conductive material 130 described above. While FIG. 3 depicts layers of build up dielectric 170 and layers of conductive material 180 on two faces of core 110, those skilled in the art will understand that layers of materials 170 and 180 may instead be employed on only one face of core 110. Additionally, those skilled in the art will appreciate that more or fewer layers of materials 170 and 180 may be employed, and that additional layers or materials not shown may also be employed.

According to this embodiment of the present invention, build up dielectric material 170 is preferably an epoxy-acrylate binder filled with zirconium tungstate. Here, build up dielectric material 170 is modified to a lesser degree than the previously-described build up dielectric material 120. That is, build up dielectric material 170 has a lower volume fraction filler loading than does material 120. Since modification with a negative CTE filler lowers the effective coefficient of thermal expansion of the build up dielectric material, modification to a lesser degree results in build up dielectric material 170 exhibiting a greater coefficient of thermal expansion than that of build up dielectric material 120. However, build up dielectric material 170 will nonetheless exhibit a lower coefficient of thermal expansion than would be the case when using a known dielectric material, such as one filled with an equal volume fraction loading of a positive CTE filler such as silica. Thus, by employing build up dielectric material 170 according to this embodiment of the present invention, the designer or manufacturer of an electronic device may obtain a build up dielectric material having the same coefficient of thermal expansion as currently known materials yet having a lower volume fraction filler loading.

A number of benefits may follow from employing build up dielectric material 170. Since material 170 has a lower volume fraction filler loading, it may exhibit improved rheological properties and enable improved substrate designs. Thus, substrate 160 may be designed with smaller features than would otherwise be used with previously known dielectric materials. For example, smaller features may be possible due to the reduced stresses in vias, resulting in the ability to go to smaller diameters and still have acceptable reliability.

It is well known in the art to apply dielectric build up layers in the form of photoactive spin-on dielectrics. Epoxy-acrylate spin-on dielectrics are applied in a liquid state and cured. Curing may occur through application of heat, light, catalysts, or other means. The photoactive nature of the spin-on dielectric material allows it to be exposed to light through a mask and developed using techniques well known in the art. The rheological properties of epoxy acrylate dielectrics are important to the design and manufacture of the electronic device, and these properties are affected by the volume fraction filler loading. Thus, for example, modifying a spin-on dielectric with a filler may increase the viscosity of the spin-on dielectric.

Employing build up dielectric material 170 will improve the ability to control the rheological properties of the dielectric material during processing, which may lead to improved reliability and manufacturability in substrate 160 and electronic devices constructed therefrom. As mentioned, the reduced volume fraction filler loading of material 170 may provide for a lower viscosity during application than would be obtained from a prior art material having the same CTE, such as material filled with silica, a positive CTE filler. This may then allow for improved adhesion between layers of materials 170 and 180 through improved flow characteristics. For example, improved step coverage may be obtained by using the lower-viscosity material 170 than would be obtained with a prior art material having the same CTE, since the prior art material would contain more filler and thus be more viscous.

Figure 4:
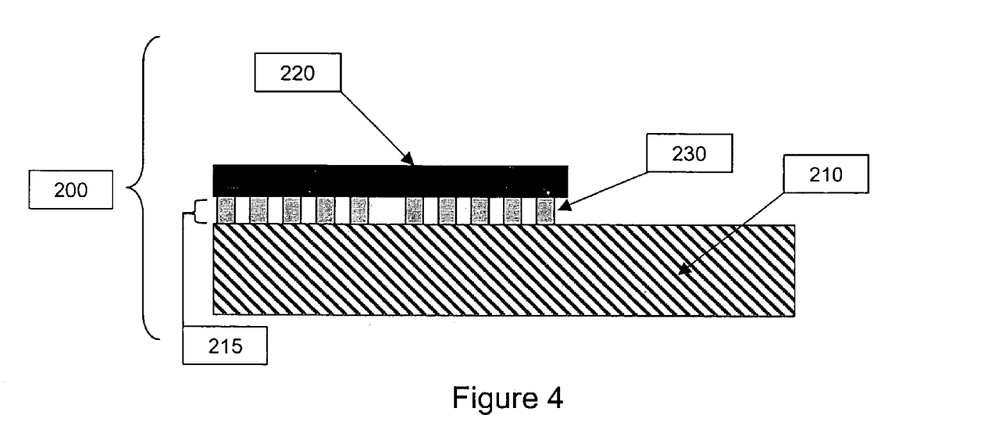
FIG. 4 depicts an embodiment of the present invention wherein a semiconductor die and a next level package have been bonded to form interconnects.
Figure 5:
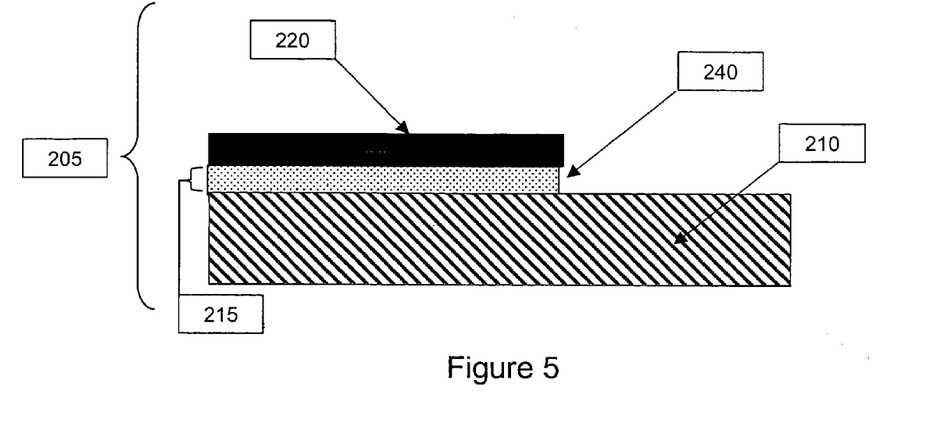
FIG. 5 depicts an embodiment of the present invention wherein a semiconductor die and a next level package have been bonded and underfilled with an underfill material containing a filler having a negative coefficient of thermal expansion.

FIGS. 4 and 5 depict another embodiment of the present invention wherein an underfill comprising a negative CTE filler is used to improve reliability in an electronic device. FIG. 4 depicts an arrangement of a next level package and a semiconductor die. Arrangement 200 comprises a next level package, herein substrate 210. Although this embodiment describes using substrate 210 as a next level package, those skilled in the art will appreciate that the invention is not limited to substrates, and may be similarly employed with other types of next level packages including, but not limited to, interposers, printed wiring boards, or printed circuit boards. Arrangement 200 further comprises semiconductor die 220. Substrate 210 and semiconductor die 220 are joined by a plurality of interconnects 230.

FIG. 5 depicts the arrangement of FIG. 4 after it has been modified by the addition of underfill material 240 into gap 215. Underfill material 240 contains a novel filler having a negative coefficient of thermal expansion, the filler preferably being zirconium tungstate.

It is well known in the art that the reliability of electronic devices can be improved by the use of an underfill agent between the semiconductor die and the substrate. Underfill agents are frequently an epoxy material modified with a positive CTE filler such as silica. Underfill agents serve to improve the mechanical strength of the bond between the semiconductor die and the substrate and which may also serve to protect the semiconductor die and/or substrate from exposure to environmental factors such as moisture. Typical epoxy materials are liquid until they are cured by application of heat, catalysts, or other means.

According to this embodiment of the present invention, underfill material 240 comprises a novel epoxy bonding agent filled with zirconium tungstate. Since zirconium tungstate has a negative coefficient of thermal expansion, averaging −1.2 ppm/degree C., underfill material 240 exhibits a lower coefficient of thermal expansion than that of known underfill materials filled with an equal volume fraction loading of a positive CTE filler such as silica.

Electronic device 205 may exhibit improved reliability due to the presence of underfill material 240 because the coefficient of thermal expansion of underfill material 240 may more closely match that of the surrounding materials. For example, the coefficient of thermal expansion of underfill material 240 may more closely match that of interconnects 230. Interconnects 230 may comprise solder having a coefficient of thermal expansion of approximately 28 ppm/ degree C. Underfill material 240 will exhibit a lower CTE than would a known underfill material filled with the same volume fraction loading of a positive CTE filler such as silica.

One technique for producing an underfill between a substrate and a semiconductor die is to apply the underfill material in a liquid state to a gap between the semiconductor die and the substrate. The liquid underfill then flows between the semiconductor die and the substrate through natural forces such as capillary action. The liquid underfill may cure as it flows between the die and the substrate or may be cured subsequently. In either case, the rheological properties of the underfill material are important to obtaining the desired mechanical strength and isolation from environmental factors.

Figure 6:
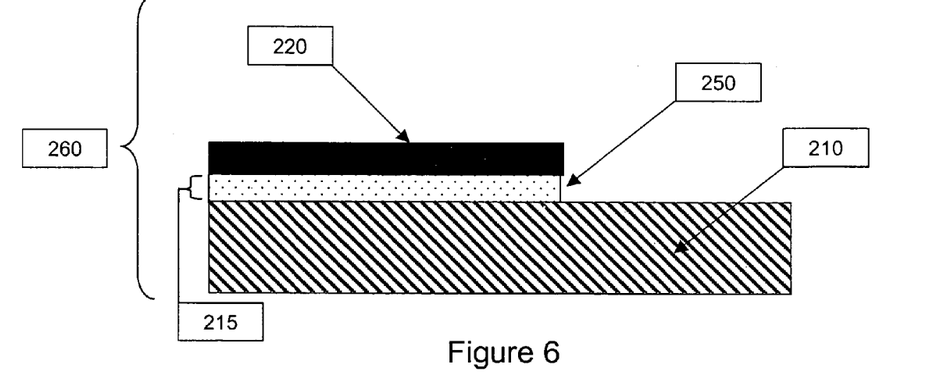
FIG. 6 depicts another embodiment of the present invention wherein a semiconductor die and a next level package have been bonded and underfilled with an underfill material containing a filler having a negative coefficient of thermal expansion and wherein the filler loading has been reduced to yield different rheological properties.

FIG. 6 depicts part of an electronic device 260 according a different embodiment of the present invention, wherein arrangement 200 described in FIG. 4 has been modified by the addition of underfill material 250. Underfill material 250 contains a filler having a negative coefficient of thermal expansion.

According to this embodiment of the present invention, underfill material 250 comprises an epoxy bonding agent filled with a filler having a negative coefficient of thermal expansion, preferably zirconium tungstate, wherein the volume fraction filler loading is less than that of the previously described underfill material 240. Since the volume fraction filler loading of underfill material 250 is somewhat less than that of underfill material 240, the coefficient of thermal expansion of material 250 will be somewhat greater than that of material 240. However, underfill material 250 may still exhibit a coefficient of thermal expansion which is equal to that of a known underfill material filled with a greater volume fraction loading of a positive CTE filler such as silica.

Since underfill material 250 may exhibit a coefficient of thermal expansion equal to that of known underfill materials while having a lower volume fraction loading, underfill material 250 may exhibit advantageous Theological properties. One such property is reduced viscosity, which may be very important in underfilling. As mentioned above, one technique for producing an underfill involves applying the underfill material in a liquid state to a gap between the semiconductor die and the substrate. The viscosity of the underfill material is an important factor in the effectiveness of this technique, because an underfill material which is too viscous may leave excessive voids, which is detrimental to the mechanical and sealing functions the underfill is intended to provide. In FIG. 6, underfill 250 is effective to achieve the mechanical and sealing functions.

Figure 7:
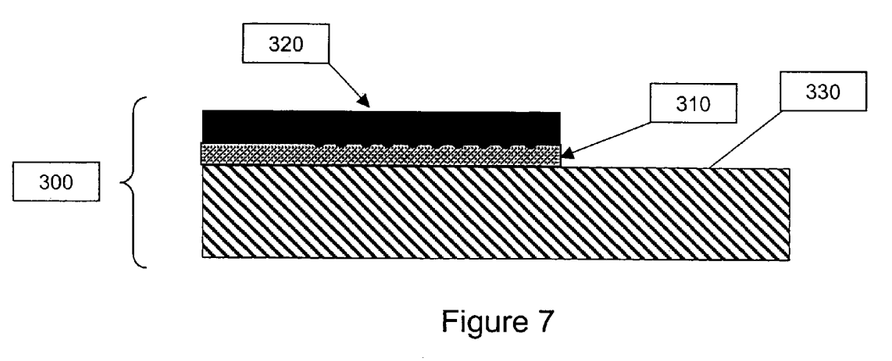
FIG. 7 depicts yet another embodiment of the present invention wherein a semiconductor die and a next level package have been underfilled with a no-flow underfill.
Figure 8:
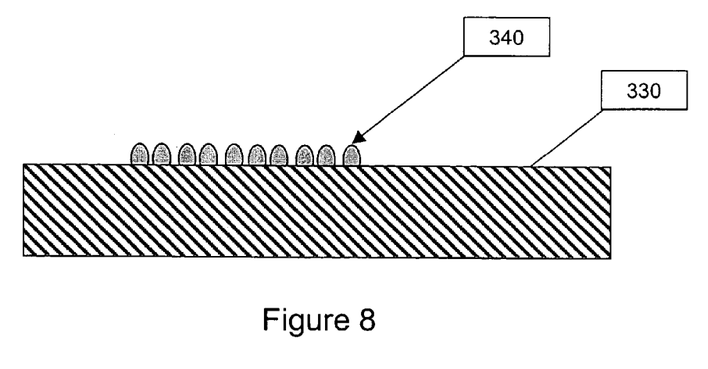
FIG. 8 depicts a next level package according to the embodiment described in FIG. 7.
Figure 9:
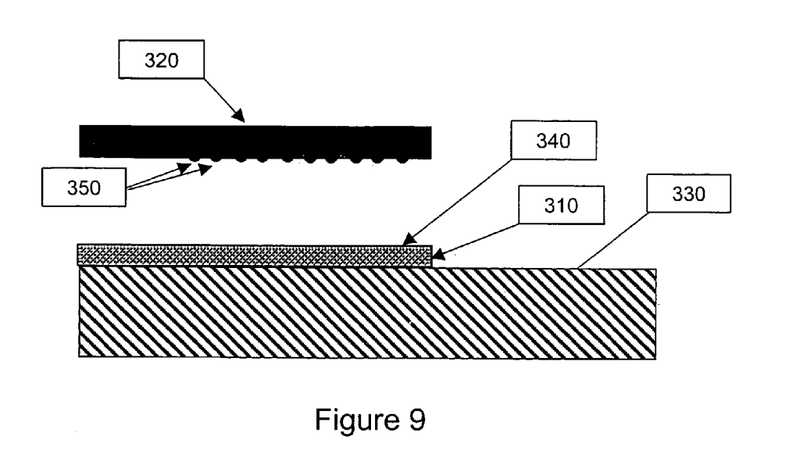
FIG. 9 depicts the next level package of FIG. 8 prepared for bonding to a semiconductor die.

FIGS. 7, 8, and 9 depict parts of an electronic device comprising a no-flow underfill according to another embodiment of the present invention. FIG. 7 depicts part of an electronic device 300 comprising a semiconductor die 320, a next level package and an underfill. In this embodiment, next level package is substrate 330. Although this embodiment describes using substrate 330 as a next level package, those skilled in the art will appreciate that the invention is not limited to substrates, and may be similarly employed with other types of next level packages including, but not limited to, interposers, printed wiring boards, or printed circuit boards. In this embodiment, the underfill is a no-flow underfill 310 containing a filler having a negative coefficient of thermal expansion, preferably zirconium tungstate. In this embodiment, no-flow underfill material 310 is applied to substrate 330 before substrate 330 is bonded to semiconductor die 320.

FIGS. 8 and 9 depict further details of electronic device 300 shown in FIG. 7. FIG. 8 depicts a more detailed view of substrate 330, showing connection points 340. Connection points 340 may comprise copper, a lead-tin eutectic, solder, or any other conductive material and are typically formed in an array or other regular pattern. Connection points 340 may be any shape including cylindrical, hemispherical, or mushroom shaped. Connection points 340 are formed on substrate 330 prior to application of no-flow underfill material 310 and prior to bonding with semiconductor die 320.

FIG. 9 depicts a more detailed view of semiconductor die 320 and substrate 330 after application of no-flow underfill material 310 and prior to bonding substrate 330 with semiconductor die 320. Semiconductor die 320 has connection points 350 which may be in the form of pads or bumps and may comprise any conductive material. Connection points 350 are typically formed in an array or other regular pattern which matches that of connection points 340 on substrate 330.

Employing a no-flow underfill in an electronic device may allow the manufacturer to combine the interconnect bonding step with the underfill step, thereby reducing the number of steps required to build an electronic device and improving efficiency. For example, the reflow of the connection points and the cure of the underfill material may be combined into a single step. However, combining these steps can lead to other difficulties. One problem that may arise is poor connections between the substrate and the die as the result of material becoming trapped between the substrate connection points and the semiconductor die connection points. This trapped material can impede the mechanical and electrical bonding of the connection points and result in electrical opens or other defects, thereby reducing manufacturing yield and increasing costs.

According to this embodiment of the present invention, no-flow underfill material 310 is applied to substrate 330 before substrate 330 and semiconductor die 320 are bonded. Semiconductor die 320 and substrate 330 are brought into contact such that connection points 340 and connection points 350 are substantially aligned and touching.

Die 320 and substrate 330 are then exposed to a heat source which causes connection points 340 and/or connection points 350 to melt, thereby bonding and forming interconnections between semiconductor die 320 and substrate 330. No-flow underfill material 310 may optionally include a fluxing agent to improve the bonding of connection points 340 with connection points 350. Preferably, the heat source concurrently heats no-flow underfill material 310 causing it to cure. Once cured, no-flow underfill material 310 will improve the mechanical strength of the bond between semiconductor die 320 and substrate 330 and will help seal them against environmental factors.

Since no-flow underfill material 310 is filled with zirconium tungstate filler, it can exhibit a coefficient of thermal expansion equivalent to that of a known no-flow underfill material, such as one filled with a positive CTE filler such as silica, but a lower volume fraction filler loading. Thus, material 310 may provide greater yields because reduced filler loading makes it less likely that material 310 will become trapped between connection points 340 and connection points 350. A manufacturer employing underfill material 310 may experience fewer defects and greater yields than would be the case using previously known compounds filled with positive CTE materials.

Figure 10:
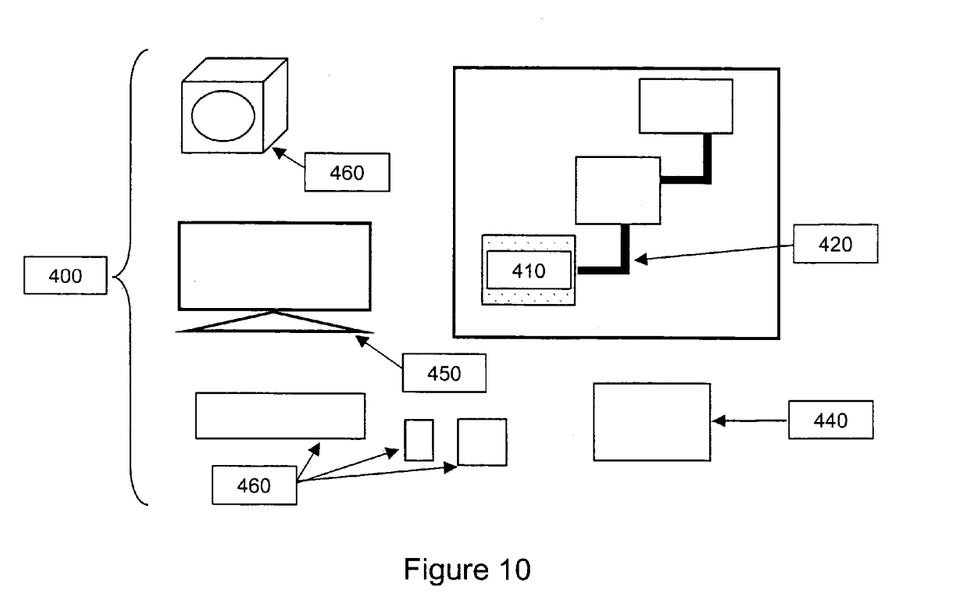
FIG. 10 depicts an electronic system containing one or more electronic devices according to an embodiment of the present invention.

FIG. 10 is a block diagram representing a simplified view of an electronic system comprising one or more electronic devices according to an embodiment of the present invention. Electronic system 400 includes an electronic component 410 which is electrically coupled to various components in electronic system 400 via system bus 420 and/or other cabling. Some interconnections between the various components are not shown in the interest of clarity. Electronic component 410 includes at least one semiconducting device, such as device 300 shown in FIG. 7. Electronic component 410 may optionally include a microprocessor, microcontroller, chip set, graphics processor or digital signal processor, and/or a custom circuit or an application-specific integrated circuit, such as a communications circuit. System bus 420 may be a single bus or any combination of busses.

Electronic system 400 may also include an external memory 440 that in turn includes one or more memory elements suitable to the particular application, such as a main memory in the form of random access memory, one or more hard disc drives, and/or one or more drives that handle removable media such as floppy diskettes, compact discs or digital video discs.

Electronic system 400 may also include a display component 450, an audio component 460, and one or more controllers 460, such as a keyboard, mouse, joys tick, scanner, or any other component that inputs information into the electronic system 400.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. An electronic device comprising:
    a substrate having an insulating core, a conductive layer disposed on said core and at least one build up dielectric layer disposed on said conductive layer, and wherein said substrate is a single unit;
    a semiconductor die disposed on said substrate; and
    at least one interconnect disposed between the substrate and the semiconductor die,
    wherein the substrate is bonded to the semiconductor die by the at least one interconnect,
    wherein the at least one build up layer comprises at least one binder and at least one filler, and
    wherein the at least one filler has a negative coefficient of thermal expansion.

2. The electronic device of claim 1, wherein the at least one filler comprises zirconium tungstate.

3. The electronic device of claim 2, wherein the zirconium tungstate is a crystalline compound having a nearly isotropic coefficient of thermal expansion of approximately −4.9 ppm/degree C. or less over at least the temperature range of −50 degrees C. to +250 degrees C.

4. A substrate for use in an electronic device, comprising:
    an insulating core;
    at least one conductive layer disposed on said core;
    at least one build up dielectric layer having at least one binder and at least one filler disposed on said conductive layer, wherein the at least one filler has a negative coefficient of thermal expansion and wherein said substrate is a single unit.

5. The substrate of claim 4, wherein the at least one filler comprises zirconium tungstate.

6. The substrate of claim 5, wherein the zirconium tungstate is a crystalline compound having a nearly isotropic coefficient of thermal expansion of approximately −4.9 ppm/degree C. or less over at least the temperature range of −50 degrees C. to −250 degrees C.

7. A material for use as a build up dielectric layer for a substrate having an insulating core and a conductive layer disposed on said core, comprising:
    at least one binder;
    at least one filler, wherein the at least one filler comprises zirconium tungstate and wherein the zirconium tungstate is a crystalline compound having a nearly isotropic coefficient of thermal expansion of approximately −4.9 ppm/degree C. or less over the temperature range of −50 degrees C. to +250 degrees C.

8. An electronic device comprising:
    a semiconductor die,
    a next level package having an insulating core, a conductive layer disposed on said core, and an at least one build up dielectric layer disposed on said conductive layer, and wherein said next level package is a single unit;
    an at least one interconnect disposed between the semiconductor die and the next level package, and
    an underfill disposed at least in part between the semiconductor die and the next level package, and
    wherein the semiconductor die is bonded to the next level package by the at least one interconnect, and
    wherein the semiconductor die is bonded to the next level package by the underfill,
    wherein the underfill comprises at least one binder and at least one filler, and wherein the at least one filler comprises zirconium tungstate; and wherein the zirconium tungstate is a crystalline compound having a nearly isotropic coefficient of thermal expansion of approximately −4.9 ppm/degree C. or less over the temperature range of −50 degrees C. to +250 degrees C.

9. The electronic device of claim 8, wherein the underfill is a no-flow underfill.

10. A method of bonding a semiconductor die to a next level package, comprising:
    providing at least one interconnect;
    providing an underfill material having at least one binder and at least one filler,
    wherein the at least one filler comprises zirconium tungstate;
    wherein the zirconium tungstate is a crystalline compound having a nearly isotropic coefficient of thermal expansion of approximately −4.9 ppm/degree C. or less over the temperature range of −50 degrees C. to +250 degrees C.;
    arranging the semiconductor die, the next level package, the at least one interconnect and the underfill material such that the at least one interconnect is disposed so as to be capable of joining the semiconductor die with the next level package and such that the underfill material is disposed at least in part between the semiconductor die and the next level package; wherein said next level package comprises an insulating core, a conductive layer disposed on said core, and at least one build up dielectric layer disposed on said conductive layer and wherein said next level package is a single unit;
    causing the at least one interconnect to bond the semiconductor die with the next level package; and
    causing the underfill material to bond the semiconductor die with the next level package.

11. An electronic system comprising:
an electronic device having a substrate, the substrate having an insulating core, and at least one build up dielectric layer and at least one conductive layer disposed on the exterior of said core and wherein the substrate is a single unit; and wherein the build up layer comprises at least one binder and at least one filler, wherein the at least one filler has a negative coefficient of thermal expansion.

12. The electronic system of claim 11, wherein the at least one filler comprises zirconium tungstate.

13. The electronic system of claim 12, wherein the zirconium tungstate is a crystalline compound having a nearly isotropic coefficient of thermal expansion of approximately −4.9 ppm/degree C. or less over the temperature range of −50 degrees C. to +250 degrees C.

14. An electronic system comprising:
an electronic device having a semiconductor die bonded to a next level package by an underfill disposed at least in part between the semiconductor die and the next level package, and wherein the next level package comprises an insulating core, a conductive layer disposed on said core and at least one build up dielectric layer disposed on the exterior of said conductive layer and wherein said next level package is a single unit;
wherein the underfill and the build up dielectric layer comprises at least one binder and at least one filler, and wherein the at least one filler comprises crystalline zirconium tungstate having a nearly isotropic coefficient of thermal expansion of approximately −4.9 ppm/degree C. or less over the temperature range of −50 degrees C. to +250 degrees C.

15. The electronic system of claim 14, wherein the next level package is chosen from the group comprising of substrates, interposers, printed wiring boards, and printed circuit boards.

16. A method of making an electronic device comprising:
providing a substrate having at least one build up layer having an insulating core, a conductive layer disposed on said core, and at least one build up layer disposed on said core, and wherein said substrate is a single unit;
providing a semiconductor die, and
forming at least one interconnect disposed between the substrate and the semiconductor die, wherein the substrate is bonded with the semiconductor die by the at least one interconnect, wherein the at least one build up layer comprises at least one binder and at least one filler, and wherein the at least one filler has a negative coefficient of thermal expansion.

17. The method of claim 16, wherein the at least one filler comprises zirconium tungstate.

* * * * *